United States Patent
Hamdi

(10) Patent No.: US 9,899,957 B2
(45) Date of Patent: Feb. 20, 2018

(54) SMART DUST-CLEANER AND COOLER FOR SOLAR PV PANELS

(71) Applicant: KING FAHD UNIVERSITY OF PETROLEUM AND MINERALS, Dhahran (SA)

(72) Inventor: Abdullah Jamal Hamdi, Mecca (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 210 days.

(21) Appl. No.: 14/698,754

(22) Filed: Apr. 28, 2015

(65) Prior Publication Data

US 2015/0311859 A1    Oct. 29, 2015

Related U.S. Application Data

(60) Provisional application No. 61/984,862, filed on Apr. 28, 2014.

(51) Int. Cl.
*H02S 40/10*        (2014.01)
*B08B 5/02*         (2006.01)
(Continued)

(52) U.S. Cl.
CPC ............... *H02S 40/10* (2014.12); *B08B 5/02* (2013.01); *B08B 7/02* (2013.01); *B08B 17/02* (2013.01);
(Continued)

(58) Field of Classification Search
CPC .... B08B 17/02; B08B 5/02; B08B 7/02; F24J 2/461; H01L 31/042; H02S 40/10;
(Continued)

(56) References Cited

U.S. PATENT DOCUMENTS

| 6,911,593 B2 * | 6/2005 | Mazumder | F24J 2/461 134/1 |
| 7,486,326 B2 * | 2/2009 | Ito | B08B 7/02 348/335 |

(Continued)

FOREIGN PATENT DOCUMENTS

| CN | 102688873 A | * | 9/2012 |
| CN | 203124361 U | * | 8/2013 |

(Continued)

*Primary Examiner* — Marc Carlson
(74) *Attorney, Agent, or Firm* — Oblon, McClelland, Maier & Neustadt, L.L.P.

(57) ABSTRACT

The smart dust-cleaner and cooler for solar photo-voltaic (PV) panels is a smooth transparent shield with low absorption coefficient (such as a plastic sheet) placed on top of the PV panel to facilitate removal of dust particulates. Two membrane vibrators (MVs) are placed on opposite sides of the PV panel. The vibrators have the ability to shake and resonate the transparent shield, dislodging the dust particulates from their positions. A compressor powered by the PV panel compresses air before a dust cleaning/cooling process, in which a short duration release of the compressed air creates an air stream over the PV panel that removes the loose dust particulates and cools the PV panel to enhance performance. Using a microcontroller-based timer, the dust cleaning/cooling process is timed for daily operation before noon, when the PV panel temperature is at its peak to maximize PV panel efficiency at maximum irradiance time.

8 Claims, 2 Drawing Sheets

(51) Int. Cl.
  *H02S 40/32* (2014.01)
  *H02S 40/42* (2014.01)
  *H02S 40/38* (2014.01)
  *B08B 7/02* (2006.01)
  *B08B 17/02* (2006.01)
  *F24J 2/46* (2006.01)
  *H01L 31/042* (2014.01)

(52) U.S. Cl.
  CPC ............ *F24J 2/461* (2013.01); *H01L 31/042* (2013.01); *H02S 40/38* (2014.12); *H02S 40/425* (2014.12); *Y02E 10/40* (2013.01); *Y02E 10/50* (2013.01)

(58) Field of Classification Search
  CPC ....... H02S 40/38; H02S 40/425; Y02E 10/40; Y02E 10/50
  See application file for complete search history.

(56) References Cited

U.S. PATENT DOCUMENTS

| | | | | |
|---|---|---|---|---|
| 8,323,421 | B2* | 12/2012 | Lee | B08B 1/008 134/113 |
| 8,474,084 | B2* | 7/2013 | Pak | F24J 2/40 134/56 R |
| 9,016,292 | B1* | 4/2015 | Schneider | F24J 2/30 134/104.2 |
| 9,130,502 | B1* | 9/2015 | Aly | F24J 2/461 |
| 2005/0044653 | A1* | 3/2005 | Wakao | B08B 3/02 15/302 |
| 2007/0240278 | A1* | 10/2007 | MacDonald | B08B 5/02 15/405 |
| 2009/0288679 | A1* | 11/2009 | Pietsch | B08B 3/12 134/1 |
| 2011/0283477 | A1* | 11/2011 | Ashpis | H01L 31/042 15/405 |
| 2012/0138123 | A1* | 6/2012 | Newdoll | F24J 2/461 136/246 |
| 2014/0041713 | A1* | 2/2014 | Adler | H02S 40/12 136/251 |
| 2014/0150818 | A1* | 6/2014 | Chow | B08B 1/00 134/6 |
| 2015/0000723 | A1* | 1/2015 | Cheng | H02S 40/425 136/248 |
| 2015/0357969 | A1* | 12/2015 | Fernandez | H02S 40/10 136/246 |

FOREIGN PATENT DOCUMENTS

| | | | |
|---|---|---|---|
| CN | 104014557 A | * | 9/2014 |
| KR | 101340039 B1 | * | 12/2013 |

* cited by examiner

SMART DUST-CLEANER AND COOLER FOR SOLAR PV PANELS

CROSS-REFERENCE TO RELATED APPLICATION

This application claims the benefit of U.S. Provisional Patent Application Ser. No. 61/984,862, filed Apr. 28, 2014.

BACKGROUND OF THE INVENTION

1. Field of the Invention

The present invention relates to photovoltaic (PV) panels, and particularly to a smart dust-cleaner and cooler for solar PV panels to increase efficiency thereof.

2. Description of the Related Art

In countries like Saudi Arabia, hot weather and dust accumulating on the PV panels affect their performance greatly. This is also a problem in some outer planets, such as Mars.

Thus, a smart dust-cleaner and cooler for solar PV panels solving the aforementioned problems is desired.

SUMMARY OF THE INVENTION

The smart dust-cleaner and cooler for solar PV panels is a smooth transparent shield with low absorption coefficient (such as a plastic sheet) placed on the top of the panel(s) to facilitate the removal of dust. Two Membrane Vibrators (MVs) are placed on opposite sides of the panel. These vibrators have the ability to shake and resonate the sheet, dislodging the dust particulates from their positions. A compressor powered by the PV panel compresses air before the cleaning process, which operates in short duration. Release of the compressed air creates an air stream over the panel that removes the loose dust and cools the panel to enhance performance. Using a microcontroller-based timer, the dust cleaning/cooling process is timed for daily operation before noon, when the panel temperature is at its peak to maximize panel efficiency at maximum irradiance time.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
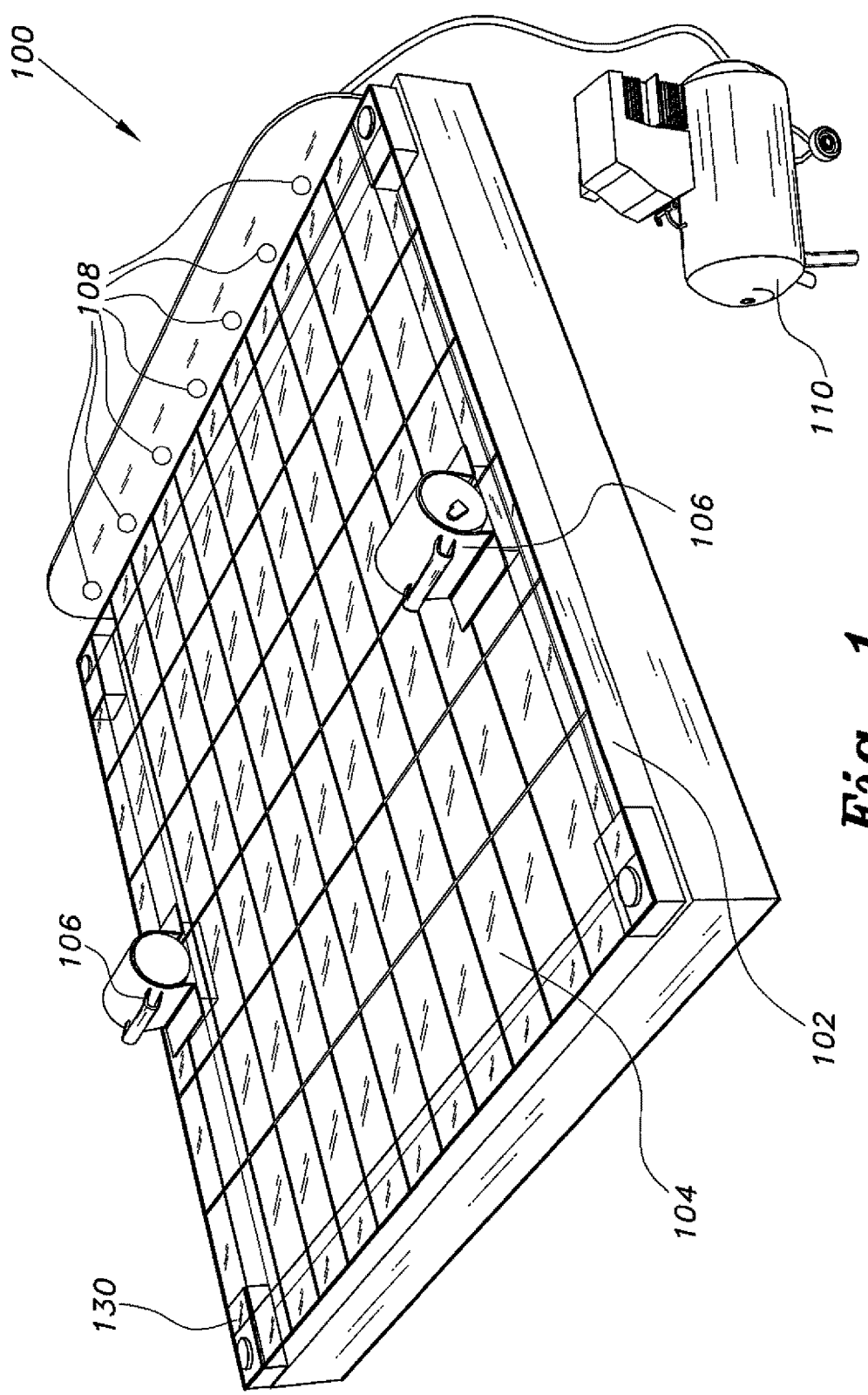
FIG. 1 is a perspective view of a smart dust-cleaner and cooler for solar PV panels according to the present invention.

As shown in FIG. 1, the smart dust-cleaner and cooler for solar PV panels 100 includes a thin, flexible planar smooth transparent shield 104 a low heat absorption coefficient (e.g., a transparent plastic sheet) mounted on top of the PV panel 102, the shield 104 functioning as a dust barrier that facilitates the removal of dust obscuring the photovoltaic elements (solar cells) of the PV panel 102. Spacing members 130 may be disposed at the corners and along the edges of the PV panel 102 to support the transparent shield 104 above the elements of the PV panel 102. Alternatively, the sheet 104 could be disposed directly on peripheral frame elements of the PV panel 102. The planar sheet 104 is dimensioned to fit on top of the PV panel 102 so that when it is disposed on or above the PV panel 102, it covers all of the PV elements to effectively shield the PV elements from dust and debris. Vibrating elements, such as the exemplary two Membrane Vibrators (MVs) 106, are disposed on top of the transparent shield 104 on opposite sides of the PV panel 102 and positioned so that the PV generating elements of the PV panel 102 are not obscured. When actuated, the vibrators 106 shake and resonate the transparent shield 104, dislodging the dust particulates from stuck positions on the shield 104. The vibrators may operate at the resonant frequency of the shield to create a standing wave in order to loosen dust and debris accumulating on the shield 104 more efficiently. An air compressor 110 is disposed in proximity to and powered by the PV panel 102 to compress air before the cleaning process, which operates in short duration. Release of the compressed air into a compressed air distribution nozzle 108 disposed along a side of the PV panel 102 creates an air stream over the PV panel 102 that blows the loose dust away from the PV elements and simultaneously cools the PV elements to enhance performance.

Figure 2:
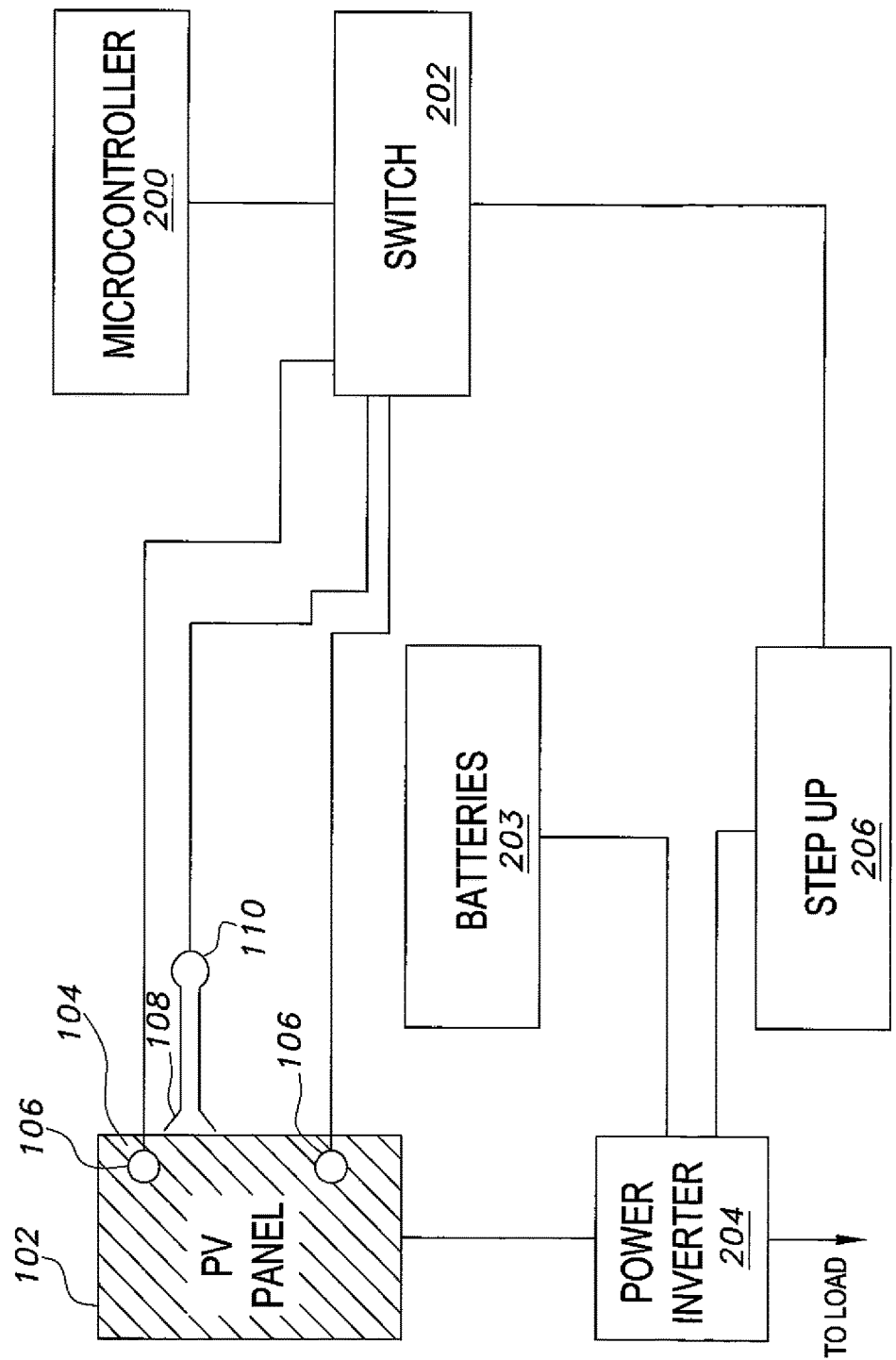
FIG. 2 is a block diagram of an electrical circuit for the smart dust-cleanser and cooler for solar PV panels of FIG. 1.

As shown in the block diagram of the circuit in FIG. 2, a microcontroller 200 (e.g., an Arduino© circuit board) controls the entire process. A timer in the microprocessor 200 is set to initiate the dust cleaning/cooling process on a daily basis around noon, local time. The air compressor 110 is timed for actuation at predetermined time intervals before the vibrating elements and compressed air distribution valve are actuated for cleaning. The noon local time is chosen because it is generally the time when the PV panel temperature is at its peak and requires cooling to maximize panel efficiency at a maximum irradiance time. A power inverter 204 has an input that is connected to the PV panel 102 and battery module 203. The output of the power inverter 204 is distributed to a load, and also to a step-up device 206. For a power source to the air compressor/valve 110 and vibrators 106, output of step-up power boosting device 206 is connected to a switch 202 that switches power ON/OFF to the vibrators 106 and to the air compressor 110 and its electronically controlled pneumatic release valve. The microcontroller 200 is connected to the switch 202 to control the timing of all switch operations controlling the vibrators 106 and the air compressor 110. The compressor 110 may be utilized to assist in cleaning and cooling an entire array of PV panels. The nozzle 108 is preferably wide enough to distribute blasts of air over a full area of the panel 102. A current sensor may be employed to detect any change in solar radiation and may be used to trigger the cleaning operation.

It should be understood that energy conversion efficiency $\eta$ of each PV unit can be calculated through the formula:

$$\eta = \frac{P_m}{E \times A_c}, \tag{1}$$

where $P_m$ is the maximum power produced (W), E is irradiance at the cell site (W/m$^2$), and $A_c$ is the area of the cell (m$^2$). Moreover, maximum power $P_m$ also satisfies the equation:

$$P_m = V_{oc} \times I_{sc} \times FF, \tag{2}$$

where $V_{oc}$ is the open circuit voltage, $I_{sc}$ is the short circuit current and FF is the fill factor of the panel (a characteristic of the PV module). Thus, to increase the output power, and hence to increase the efficiency of the module, we should increase either the open circuit voltage or the short circuit current. $I_{sc}$ can be increased by increasing the number of photons reaching the inner layer. Therefore, removing the dust accumulated on the panel will increase the number of photons hitting the panel and increase the short circuit current. The covering layer should be transparent and with low absorption coefficient α, so that light is transmitted thoroughly to the inner layer. The power at temperature T ($P_T$) can be increased by reducing the temperature of the panel according to the following equation, $$P_T P_{STC} + (dP/dT) \times (T - T_{STC}), \qquad (3)$$

where (dP/dT) is the rate of power change per degree Celsius (a characteristic of the panel and always negative), T is temperature, and STC is standard test conditions (at 20° C.). Therefore, the cooling process will increase the output power; increasing temperature of the module reduces the performance. This is more noticeable in hot countries like Saudi Arabia.

It is to be understood that the present invention is not limited to the embodiments described above, but encompasses any and all embodiments within the scope of the following claims.

I claim:

1. A smart dust-cleaner and cooler for solar photo-voltaic (PV) panels, comprising:
    a planar, transparent sheet dimensioned and configured to fit on top of a PV panel comprising a plurality of PV elements, the transparent sheet being disposed over the PV panel and covering substantially all of the PV elements;
    a plurality of vibrating elements disposed on top of the transparent sheet at opposite sides of the PV panel configured to shake and resonate the transparent sheet to dislodge dust particulates;
    an air compressor disposed in proximity to the PV panel, the air compressor having an electronically controlled output valve;
    a compressed air distribution nozzle disposed along an edge of the PV panel and oriented to direct an air stream over the PV panel to blow the dust particulates away from the plurality of PV elements and simultaneously cool the plurality of PV elements, the output valve of the air compressor being connected to the compressed air distribution nozzle;
    a switch;
    a power source connected to the air compressor and the plurality of vibrating elements via the switch;
    the output valve and a vibrator timer connected to the switch to actuate the switch at predetermined time intervals to simultaneously energize the plurality of vibrating elements and the output valve, the vibrator timer also being connected to the air compressor for actuating the air compressor at predetermined time intervals before the plurality of vibrating elements and the output valve are actuated.

2. The smart dust-cleaner and cooler for solar PV panels according to claim 1, wherein the vibrator timer comprises a microprocessor.

3. The smart dust-cleaner and cooler for solar PV panels according to claim 1, further comprising a plurality of spacers disposed on a frame of the PV panel, the transparent sheet being supported on the plurality of spacers.

4. The smart dust-cleaner and cooler for solar PV panels according to claim 1, wherein the transparent sheet is directly affixed to a frame of the PV panel.

5. The smart dust-cleaner and cooler for solar PV panels according to claim 1, wherein the plurality of vibrating elements comprise a plurality of membrane vibrators.

6. The smart dust-cleaner and cooler for solar PV panels according to claim 5, wherein the plurality of membrane vibrators consist of two membrane vibrators disposed on opposite sides of the PV panel.

7. The smart dust-cleaner and cooler for solar PV panels according to claim 1, wherein the power source comprises:
    a battery module connected to the PV panel; and
    a power inverter connected to the battery module and connected directly to the PV panel.

8. The smart dust-cleaner and cooler for solar PV panels according to claim 7, further comprising a step-up element connected between the power inverter and the switch, the step-up element boosting power for operation of the air compressor and the plurality of vibrating elements.

* * * * *